(12) United States Patent
Lin et al.

(10) Patent No.: US 6,242,315 B1
(45) Date of Patent: Jun. 5, 2001

(54) METHOD OF MANUFACTURING MIXED MODE SEMICONDUCTOR DEVICE

(75) Inventors: Chen-Bin Lin, Taipei; Cheng-Hui Chung, Hsinchu Hsien; Yei-Hsiung Lin, Hsinchu; Ching-Chun Huang, Taichung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/186,126

(22) Filed: Nov. 4, 1998

(51) Int. Cl.$^7$ .................................................. H01L 21/20
(52) U.S. Cl. .......................... 438/393; 438/396; 438/253; 438/629
(58) Field of Search ..................... 438/393, 396, 438/253, 629, 399, 637, 263, 624

(56) References Cited

U.S. PATENT DOCUMENTS 5,610,101 * 3/1997 Koyama ................................ 438/396
6,100,155 * 8/2000 Hu ........................................ 438/253

* cited by examiner

Primary Examiner—Charles Bowers
Assistant Examiner—Yennhu B. Huynh
(74) Attorney, Agent, or Firm—Thomas, Kayden, Horstemeyer & Risley

(57) ABSTRACT

A method of manufacturing the metallic electrodes of a capacitor in a mixed mode semiconductor device. The method comprises the steps of providing a substrate having a conductive layer and the lower electrode of a capacitor formed thereon, and then depositing a dielectric layer over the substrate. A first opening and a second opening are then formed in the dielectric layer. The first opening exposes a portion of the conductive layer while the second opening exposes a portion of the lower electrode. Finally, a conductive plug and the upper electrode of the capacitor are formed in the respective first and second openings that are in corresponding positions above the conductive layer and lower electrode, respectively.

13 Claims, 3 Drawing Sheets

METHOD OF MANUFACTURING MIXED MODE SEMICONDUCTOR DEVICE

BACKGROUND OF THE INVENTION

1. Field of Invention

The present invention relates to a method of manufacturing semiconductor devices. More particularly, the present invention relates to a method of manufacturing the metallic capacitor electrodes of a mixed mode semiconductor device.

2. Description of Related Art

In general, the analog portion of mixed mode logic circuit uses a pair of polysilicon layers as the electrodes of a capacitor. However, polysilicon electrodes have a number defects including the formation of depletion layers. Depletion layers in the polysilicon electrode will result in the dependency of charging/discharging operations of a capacitor on the number of manufacturing defects. Moreover, the process of fabricating polysilicon electrodes is relatively complicated.

In particular, heat treatment, etching and capacitor efficiency are difficult to control. Furthermore, the resistance of a polysilicon electrode is quite high. Consequently, capacitors having metallic electrodes are gradually replacing the conventional polysilicon electrodes. However, there are several processing problems in the fabrication of metallic electrodes including the etching of metallic layer and the damaging effect of etching on the peripheral dielectric layer.

FIGS. 1A through 1D are cross-sectional views showing the progression of manufacturing steps in forming the metallic electrodes of a capacitor in a mixed mode semiconductor device according to a conventional method. First, as shown in FIG. 1A, a substrate 10 is provided, and then a sputtering method or chemical vapor deposition method is used to deposit a metallic layer. Next, conventional photolithographic and etching processes are used to pattern the metallic layer to form metallic layers 12 and 14. The metallic layer 12 serves as the lower electrode of the capacitor, whereas the metallic layer 14 serves as an interconnect wire.

Next, as shown in FIG. 1B, a chemical vapor deposition method is used to form an oxide layer 16 over the substrate 10 and the metallic layers 12 and 14. Thereafter, a sputtering method or a chemical vapor deposition method is used to form a metallic layer 18 over the oxide layer 16.

Next, as shown in FIG. 1C, conventional photolithographic and etching processes are used to pattern the metallic layer 18 and the oxide layer 16, thereby forming a metallic layer 20 and a dielectric layer 22, respectively. The metallic layer 20 serves as the upper electrode of the capacitor and is above the metallic layer 12. In the conventional technique, the metallic layer 20 does not cover the metallic layer 12 completely so that a portion of the metallic layer 12 is exposed.

In the process of patterning the metallic layer 18 and the oxide layer 16 to form the metallic layer 20 and the dielectric layer 22, etching must stop precisely at the metallic layer 12. However, the metallic layer 12 is flanked by a thick metallic layer 18. Since the metallic layer 12 and the metallic layer 18 are made from metallic material, the metallic layer 12 may be over-etched thus damaging the region 21 above the metallic layer 12. In addition, a portion of the dielectric layer 22 may also be damaged leading to a degeneration of its insulating effects.

Next, as shown in FIG. 1D, a low-pressure chemical vapor deposition method is used to form a dielectric layer 23 over the entire semiconductor structure including the metallic layer 14, the metallic layer 20 and the exposed metallic layer 12. Subsequently, conventional photolithographic and etching processes are again used to form dielectric openings 24, 26 and 28. The openings 24, 26 and 28 expose the metallic layer 14, the metallic layer 20 and the metallic layer 12, respectively. After that, a sputtering method or a chemical vapor deposition method is again used to deposit a layer of metallic material into the openings 24, 26 and 28, thereby forming metal plugs 30, 32 and 34, respectively. The metal plugs 30, 32 and 34 form electrical contact with metallic layers 14, 20 and 12, respectively. Finally, other processing operations necessary for forming a complete semiconductor device are carried out.

However, the aforementioned technique of forming metal electrodes in a capacitor has other defects too. Because the step height between semiconductor devices is high, subsequent processing operations are difficult to carry out. Since difference in depth between dielectric openings varies considerably due to a great different in their step height, judging when to stop the etching operation becomes difficult.

In light of the foregoing, there is a need to provide an improved method of forming the metallic electrodes of a capacitor.

SUMMARY OF THE INVENTION

Accordingly, the present invention is to provide a method of forming the metallic electrodes of a capacitor in a mixed mode semiconductor device capable of reducing step heights between semiconductor devices so that etching problems can be avoided.

To achieve these and other advantages and in accordance with the purpose of the invention, as embodied and broadly described herein, the invention provides a method of forming the metallic electrodes of a capacitor in a mixed mode semiconductor device. The method comprises the steps of providing a substrate, and then forming the lower electrode of a capacitor and a first conductive layer simultaneously. Thereafter, a first dielectric layer is formed over the lower electrode and the first conductive layer. Next, a first opening is formed in the dielectric layer exposing a portion of the lower electrode. Subsequently, a chemical vapor deposition method is used to deposit a layer of dielectric material over the first opening and the lower electrode, thereby forming the dielectric layer of a capacitor. Thereafter, a second opening is formed in the first dielectric layer, exposing a portion of the first conductive layer. Next, a second conductive layer is deposited into the first opening and the second opening. Then, the second conductive layer is polished to form a plug and the upper electrode of a capacitor in the first dielectric layer. The plug and the upper electrode are located directly above the first conductive layer and the lower electrode respectively.

One aspect of this invention is that the upper electrode and the metal plug are formed at the same time. Therefore, processing steps are quite simple. Moreover, step height between different mixed mode semiconductor devices is small, thus facilitating photolithographic and etching operations.

Another aspect of this invention is that the process of fabricating the upper electrode of a capacitor is compatible with the manufacturing of a conventional metal plug, or, in other words, the manufacturing of metallic via. Therefore, metal plugs and the upper electrode can be fabricated in a single operation, hence simplifying manufacturing steps.

One further aspect of this invention is that the same metallic material is used for forming both the upper electrode and the metal plug. Therefore, the upper electrode and the metal plug can be formed together, thereby saving extra depositing steps.

In yet another aspect of this invention, etching operations associated with the metallic layer and the dielectric layer as well as mechanical polishing operations will not cause any damage to the dielectric layer. Hence, the dielectric layer can have the functional capacity and electrical properties as originally designed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
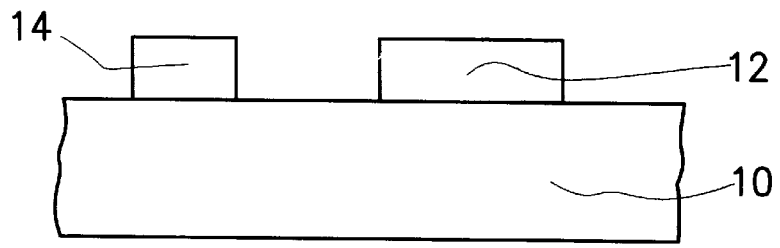
FIGS. 1A through 1D are cross-sectional views showing the progression of manufacturing steps in forming the metallic electrodes of a capacitor in a mixed mode semiconductor device according to a conventional method.
Figure 1B:
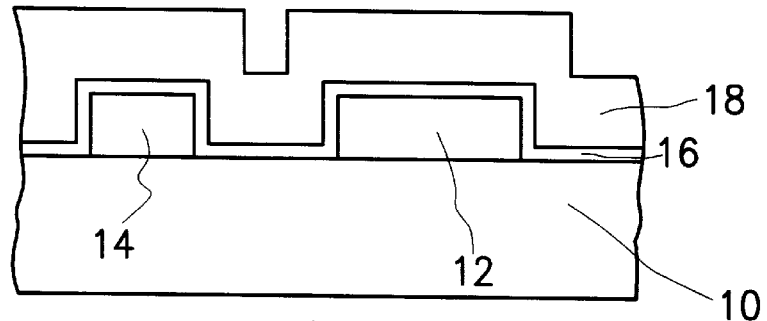
Figure 1C:
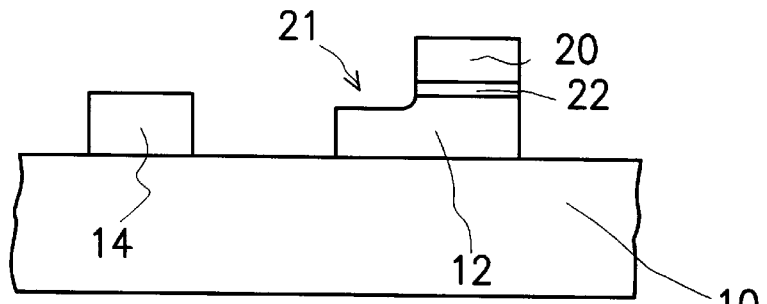
Figure 1D:
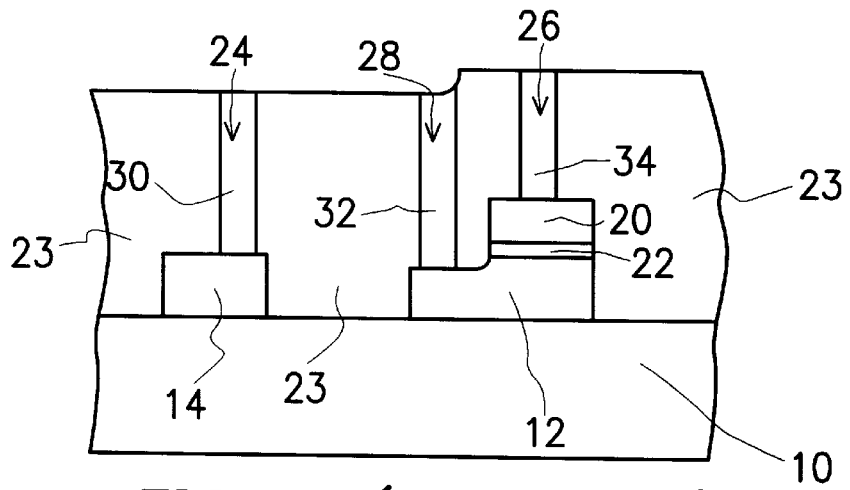

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in forming the metallic electrode of a capacitor in a mixed mode semiconductor device according to one preferred embodiment of this invention.

Figure 2A:
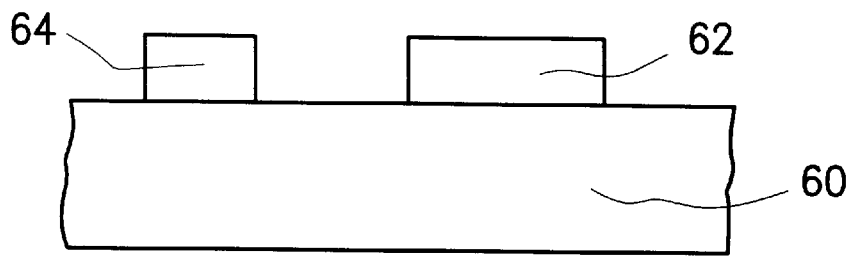
FIGS. 2A through 2E are cross-sectional views showing the progression of manufacturing steps in forming the metallic electrode of a capacitor in a mixed mode semiconductor device according to one preferred embodiment of this invention.

First, as shown in FIG. 2A, a substrate 60 is provided. Then, a metallic layer is formed over the substrate 60 using, for example, a sputtering method or a chemical vapor deposition method. The metallic layer can be made from material including, for example, aluminum, copper, aluminum-copper alloy or tungsten, but preferably the metallic layer is made from aluminum-copper alloy. Thereafter, conventional photolithographic and etching methods are used to pattern the metallic layer to form a metallic layer 62 and another metallic layer 64. The metallic layer 62 serves as the lower electrode of a capacitor, whereas the metallic layer 64 acts as an interconnect wire.

Figure 2B:
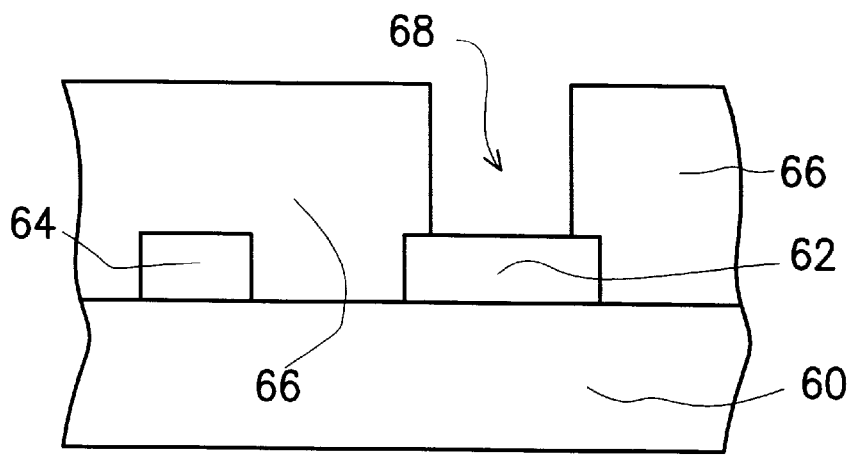

Next, as shown in FIG. 2B, a dielectric layer 66 is formed over the substrate 60 and the metallic layers 60 and 62 using, for example, a low-pressure chemical vapor deposition method. Subsequently, conventional photolithographic and etching methods are again used to pattern the dielectric layer 66 forming a dielectric opening 68. The dielectric opening 68 exposes the metallic layer 62, which serves only as an inter-metal dielectric layer.

Figure 2C:
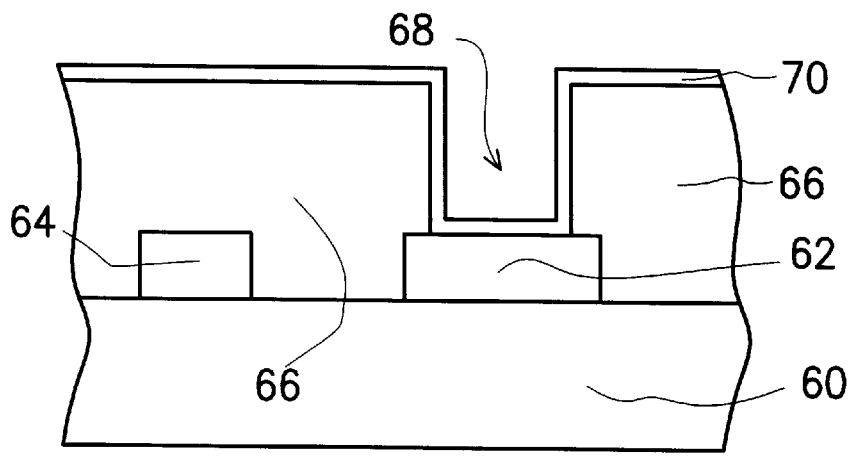

Next, as shown in FIG. 2C, another dielectric layer 70, such as an oxide layer, is formed over the entire dielectric layer 66 using, for example, a chemical vapor deposition method. The dielectric layer 70 also covers the interior of the dielectric opening 68 and the metallic layer 62 as well.

Figure 2D:
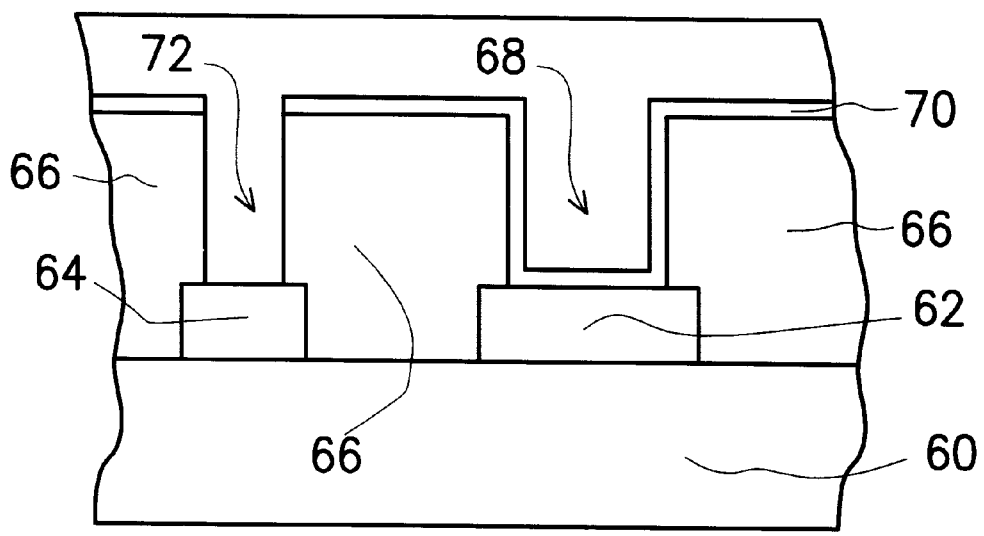

Next, as shown in FIG. 2D, conventional photolithographic and etching methods are again used to pattern the dielectric layer 70 to form another dielectric opening 72. The dielectric opening 72 exposes the metallic layer 64, only. Subsequently, metallic material is deposited over the dielectric layer 70 to form a metallic layer 74 using, for example, a chemical vapor deposition method or a sputtering method. The metallic material is deposited into the dielectric openings 68 and 72, wherein the metallic material in the dielectric opening 72 is allowed to contact the metallic layer 64. The metallic layer 74 can be made from material including, for example, aluminum, copper, aluminum-copper alloy or tungsten, but preferably the metallic layer 74 is made from aluminum-copper alloy.

Figure 2E:
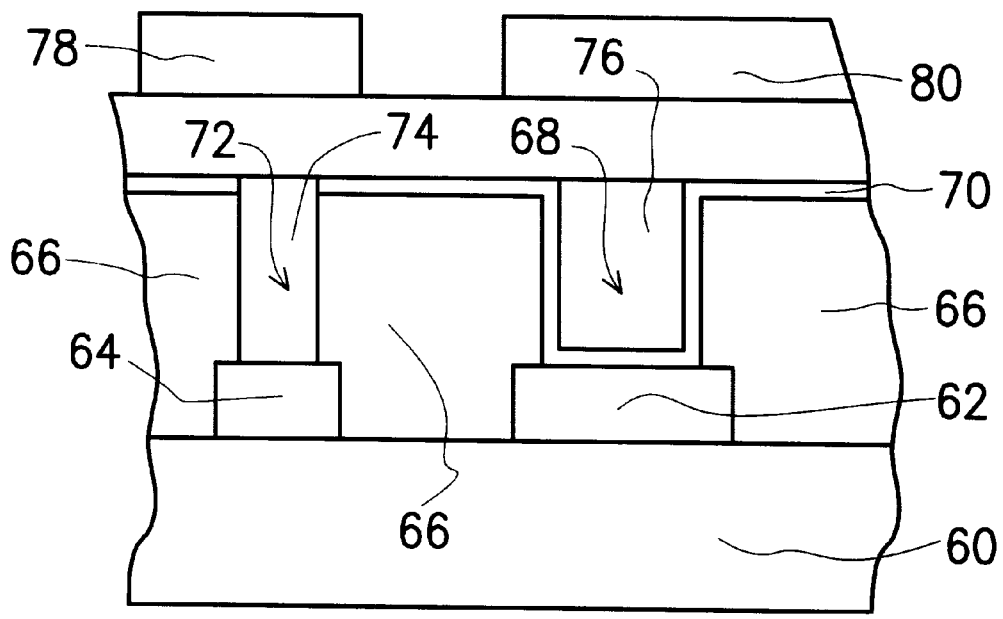

Next, as shown in FIG. 2E, the metallic layer 74 is polished to expose the dielectric layer 70 using a chemical-mechanical polishing method. Consequently, the metallic layer 74 is turned into a metal plug 74 and a metallic layer 76. The metal plug 74 is in contact with the metallic layer 64, whereas the metallic layer 76 is isolated from the metallic layer 62 by the dielectric layer 70. The metallic layer 76 serves as the upper electrode of a capacitor. Thereafter, a chemical vapor deposition method or a sputtering method is used to form a metallic layer over the metal plug 74 and the metallic layer 76. Finally, conventional photolithographic and etching methods are again used to pattern the metallic layer to form metallic layers 78 and 80. The metallic layers 78 and 80 are in contact with the metallic plug 74 and the metallic layer, 76 respectively.

In summary, one aspect of this invention is that the upper electrode and the metal plug are formed at the same time. Therefore, processing steps are quite simple. Moreover, step height between different mixed mode semiconductor devices is small, thus facilitating photolithographic and etching operations.

In another aspect of this invention, the process of fabricating the upper electrode of a capacitor is compatible with the manufacturing of a conventional metal plug or metallic via. Therefore, metal plugs and upper electrode can be fabricated in a single operation, and hence simplifying the manufacturing steps.

In one further aspect of this invention, the same metallic material is used for forming both the upper electrode and the metal plug. Therefore, the upper electrode and the metal plug can be formed together, thereby saving extra depositing steps.

In yet another aspect of this invention, etching operations associated with the metallic layer and the dielectric layer as well as mechanical polishing operations will not cause any damage to the dielectric layer. Hence, the dielectric layer can have the functional capacity and electrical properties as originally designed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a mixed mode semiconductor device, the method comprising:

providing a substrate having the lower electrode of a capacitor and a first conductive layer formed thereon;

forming a first dielectric layer over the lower electrode and the first conductive layer;

forming a first opening in the first dielectric layer, wherein the first opening exposes a portion of the lower electrode;

forming a second dielectric layer to line the first opening, wherein the second dielectric layer makes contact with the lower electrode;

forming a second opening in the first dielectric layer, wherein the second opening exposes a portion of the first conductive layer;

forming a second conductive layer over the first dielectric layer, wherein the second conductive layer also completely fills the first and second openings; and polishing the second conductive layer so that a plug and the upper electrode of the capacitor are simultaneously formed, wherein the plug and the upper electrode are formed directly above the first conductive layer and the lower electrode, respectively.

2. The method of claim 1, wherein the lower electrode, the first conductive layer and the second conductive layer are formed from metallic material.

3. The method of claim 1, wherein the material for forming the lower electrode, the first conductive layer and the second conductive layer are selected from the group of metals that includes aluminum, copper, aluminum-copper alloy and tungsten.

4. The method of claim 1, wherein the step of polishing the second conductive layer includes a chemical-mechanical polishing method.

5. The method of claim 1, wherein the plug and the upper electrode of the capacitor are formed together in the same operation.

6. A method of manufacturing mixed mode semiconductor device, the method comprising the steps of:

providing a substrate having a lower electrode of a capacitor and a conductive layer formed thereon;

forming a dielectric layer having a first opening and a second opening over the lower electrode and the conductive layer, wherein the first opening and the second opening expose a portion of the lower electrode and the conductive layer, respectively;

forming a capacitor dielectric layer to line the first opening; and forming a plug and an upper electrode of the capacitor in the first opening and the second opening, respectively, in a single operation.

7. The method of claim 6, wherein the step of forming the first opening and the second opening further includes the substeps of:

patterning the dielectric layer to form the first opening that exposes a portion of the lower electrode;

forming the dielectric layer of a capacitor over the first opening and the exposed lower electrode; and patterning the dielectric layer to form the second opening that exposes a portion of the conductive layer.

8. The method of claim 6, wherein the step of forming the plug and the upper electrode of the capacitor further includes the substeps of:

depositing conductive material into the first opening and the second opening as well as over the dielectric layer to form a conductive layer; and polishing the conductive layer to form the plug and the upper electrode of the capacitor.

9. The method of claim 8, wherein the plug and the upper electrode of the capacitor are formed in a single operation.

10. The method of claim 6, wherein the lower electrode, the plug, the conductive layer and the upper electrode are formed from metallic material.

11. The method of claim 6, wherein the material for forming the lower electrode, the plug, the conductive layer and the upper electrode are selected from a group of metals that includes aluminum, copper, aluminum-copper alloy and tungsten.

12. A method of manufacturing a mixed mode semiconductor device, the method comprising:

providing a substrate having the lower electrode of a capacitor and a first conductive layer formed thereon;

forming a first dielectric layer over the lower electrode and the first conductive layer;

forming a first opening in the first dielectric layer, wherein the first opening exposes a portion of the lower electrode;

forming a second dielectric layer to line the first opening, wherein the second dielectric layer makes contact with the lower electrode;

forming a second opening in the first dielectric layer, wherein the second opening exposes a portion of the first conductive layer;

forming a second conductive layer over the first dielectric layer, wherein the second conductive layer completely fills the first and second openings; and polishing the second conductive layer so that a plug and the upper electrode of the capacitor are simultaneously formed, wherein the plug and the upper electrode are formed directly above the first conductive layer and the lower electrode, respectively, and each above steps performed in the order recited.

13. A method of manufacturing a mixed mode semiconductor device, the method comprising:

providing a substrate having the lower electrode of a capacitor and a first conductive layer formed thereon;

forming a first dielectric layer over the lower electrode and the first conductive layer;

forming a first opening in the first dielectric layer, wherein the first opening exposes a portion of the lower electrode;

forming a second dielectric layer on the first dielectric layer, wherein the second dielectric layer lines the first opening and makes contact with the lower electrode;

forming a second opening through the second dielectric layer and the first dielectric layer, wherein the second opening exposes a portion of the first conductive layer;

forming a second conductive layer over the first dielectric layer, wherein the second conductive layer completely fills the first and second openings; and polishing the second conductive layer so that a plug and the upper electrode of the capacitor are simultaneously formed, wherein the plug and the upper electrode are formed directly above the first conductive layer and the lower electrode, respectively.

* * * * *